(12) United States Patent
Morkovich

(10) Patent No.: US 7,098,750 B2
(45) Date of Patent: Aug. 29, 2006

(54) WIDE FREQUENCY RANGE AGILE VOLTAGE CONTROLLED OSCILLATOR

(76) Inventor: Mikhail Morkovich, 2383 E. 14th St., Apt #3A, Brooklyn, NY (US) 11229

( * ) Notice: Subject to any disclaimer, the term of this patent is extended or adjusted under 35 U.S.C. 154(b) by 14 days.

(21) Appl. No.: 10/918,844

(22) Filed: Aug. 16, 2004

(65) Prior Publication Data

US 2006/0033581 A1    Feb. 16, 2006

(51) Int. Cl.
H03L 7/09       (2006.01)
H03B 5/08       (2006.01)
H03B 5/18       (2006.01)

(52) U.S. Cl. ............... 331/177 V; 331/36 C; 331/117 R; 331/167

(58) Field of Classification Search ........... 331/177 V, 331/36 C, 167, 117 R
See application file for complete search history.

(56) References Cited

U.S. PATENT DOCUMENTS 5,923,221 A * 7/1999 Dobrovolny ............ 331/117 D
6,239,664 B1 * 5/2001 Northam ................... 42/16
6,466,099 B1 * 10/2002 Festag ................... 331/117 R
6,486,744 B1 * 11/2002 Cann .................... 331/117 D
2004/0222858 A1 * 11/2004 Corse et al. ............. 331/36 C

FOREIGN PATENT DOCUMENTS

GB         2401263 A  * 11/2004

* cited by examiner

Primary Examiner—Robert Pascal
Assistant Examiner—James Goodley
(74) Attorney, Agent, or Firm—Siegmar Silber, Esq.

(57) ABSTRACT

A voltage controlled oscillator that can rapidly change frequencies over a wide range is disclosed. The voltage controlled oscillator has a transistor having a base, an emitter and a collector. An output port and a power supply port are connected to the collector. A high pass filter is connected between ground and the base of the transistor. A tuning element is connected between the high pass filter and ground. The tuning element includes a pair of varactor diodes. The varactor diodes have their cathodes connected together at a first node. A series combination of a resistor and inductor are connected between a tuning port and the first node. A capacitor is connected between the first node and the emitter.

19 Claims, 8 Drawing Sheets

WIDE FREQUENCY RANGE AGILE VOLTAGE CONTROLLED OSCILLATOR

BACKGROUND

1. Field of the Invention

This invention relates to oscillators in general and more particularly to a voltage controlled oscillator that can rapidly change frequencies over a wide range.

2. Description of Related Art

Voltage controlled oscillators are used in many electronic applications such as telecommunications. A voltage-controlled oscillator (VCO) is a circuit that generates an oscillating signal at a frequency proportional to an externally applied control voltage. Modern electronics often require a VCO to operate over large frequency ranges. Some applications require the voltage controlled oscillator to rapidly change the carrier frequency. These types of oscillators are referred to as agile voltage controlled oscillators.

The ability of a voltage controlled oscillator to change frequencies can be measured by 3 dB modulation bandwidth and tuning time. Normally, the 3 dB modulation bandwidth is determined at a low modulation index. This means that the deviation of the carrier frequency is significantly less than the carrier frequency itself or the amplitude of the modulating signal is small.

There are applications where the carrier frequency must change significantly in a short period of time. In these applications, the frequency deviation is large and the amplitude of the modulating signal applied to the tuning port has a large value. In some cases, the amplitude may cover the entire tuning voltage range. Tuning the frequency fast requires the modulating signal applied to the tuning port to have a large rise time or dv/dt, which is measured in volts per second.

For example, the modulating signal applied to the tuning port of a VCO could increase from 1 volt to 11 volts in 2 nanoseconds. This gives a rise time of 5 volts per nanosecond. This sharp or large rise time signal applied to the tuning port penetrates beyond the tuning components (typically varactor diodes) and can completely disrupt the normal operation of the VCO. Voltage controlled oscillators that are designed with a wide 3 dB modulation bandwidth such as 10 MHz cannot handle a 5 volt per nanosecond tuning signal.

Figure 1:
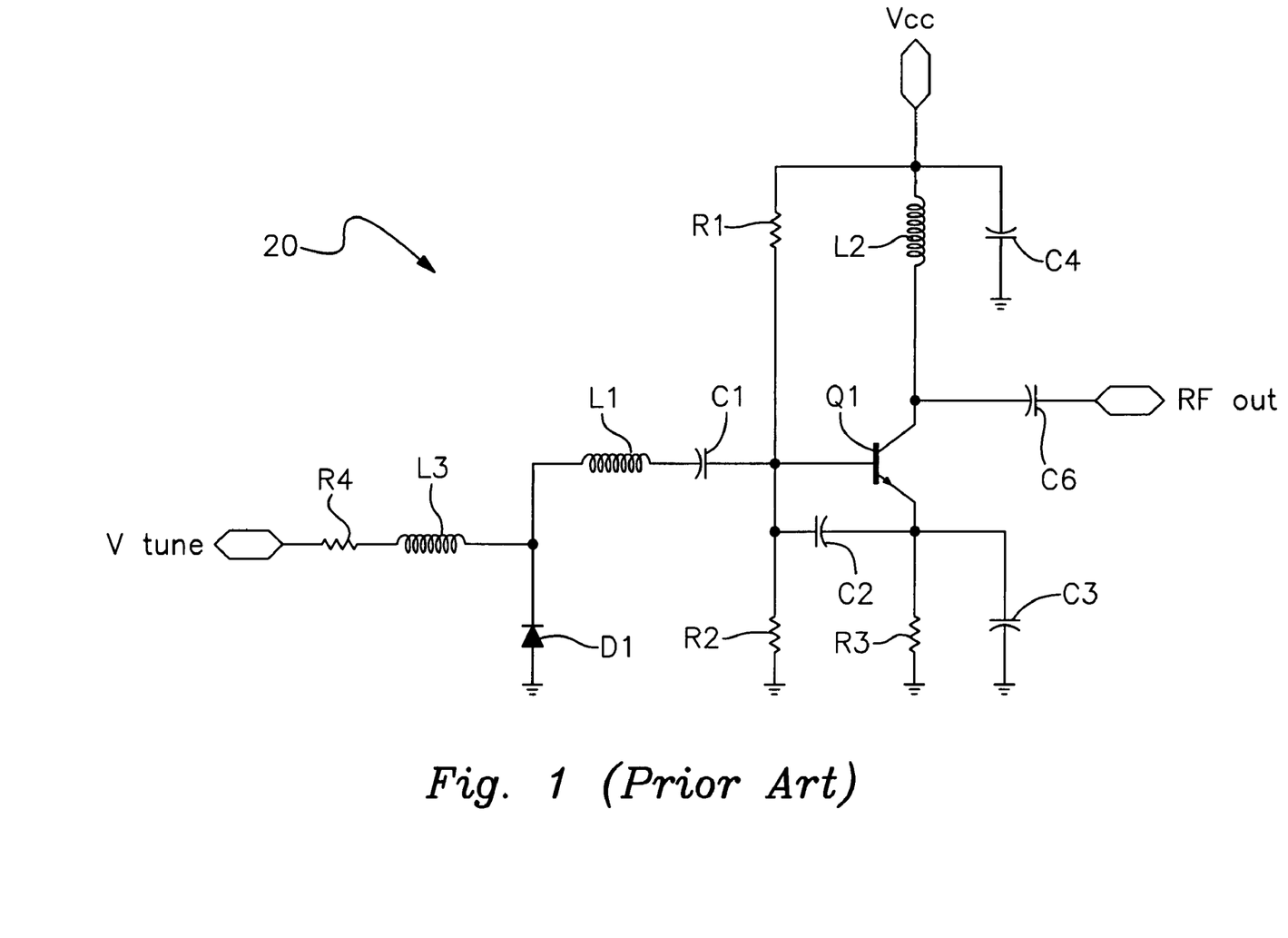
FIG. 1 is a schematic diagram of a Clapp voltage controlled oscillator of the prior art.

Referring to FIG. 1, a schematic diagram of a typical Clapp voltage controlled oscillator 20 is shown. The typical frequency tuning range of the Clapp oscillator is approximately a 2:1 ratio. For a wide frequency tuning range capacitors C1 and C2 should be large. When a large rise time signal is applied to the tuning port Vtune, capacitor C1 will start to charge. The charge time is determined by the capacitance value of C1 and the total resistance. The total resistance is equal to Rtune+R4+R2, where R tune is the tuning port source impedance and R4, R2 are the resistances of resistors R4 and R2.

Figure 2:
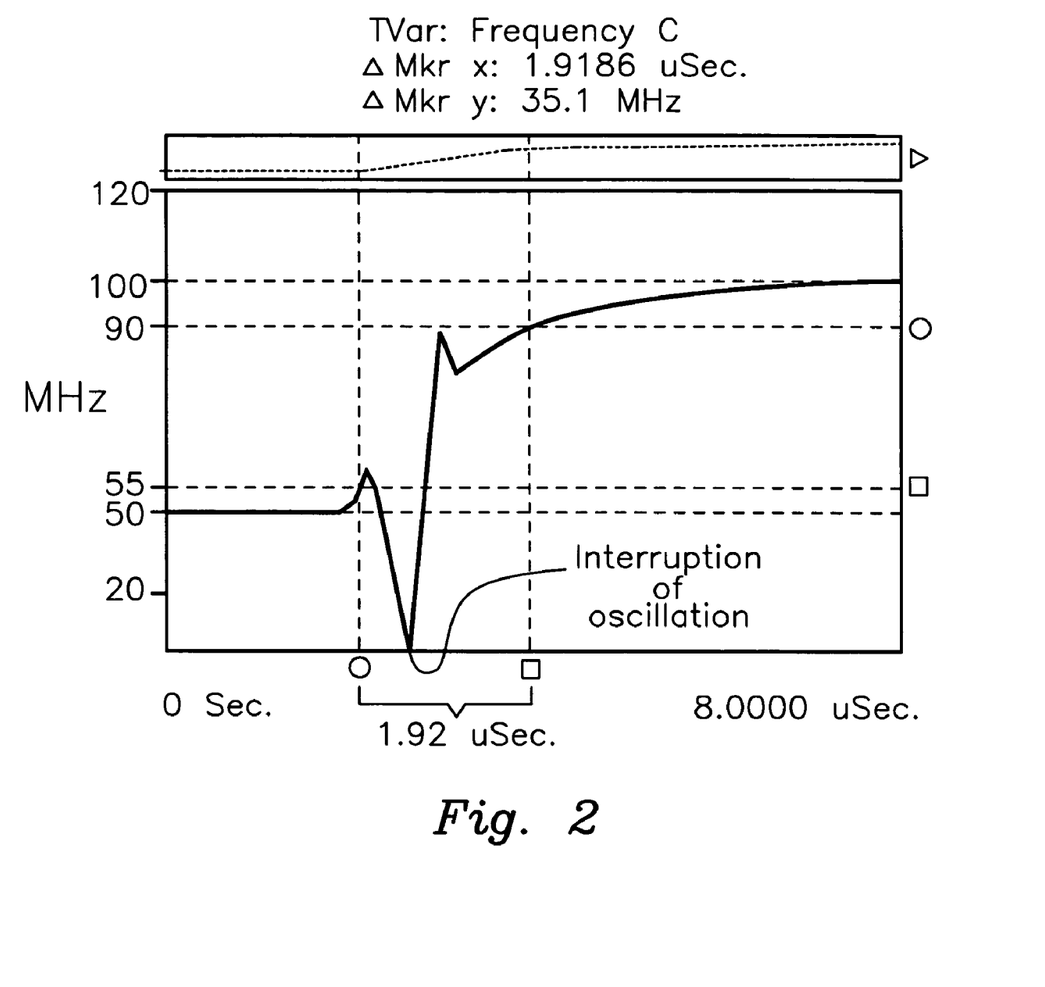
FIG. 2 is a graph of the frequency response of the Clapp oscillator of FIG. 1 when a sharp step-up voltage is applied to the tuning port.

Referring to FIG. 2, a graph of the frequency response of the Clapp oscillator of FIG. 1 when a sharp step-up voltage is applied to the tuning port is shown. If capacitor C1 has a value of 1000 picofarads, R4 is 4000 ohms and R2 is 4000 ohms, the time constant will be 8 microseconds. The 3 dB modulation bandwidth is 60 KHz. The fast rise time of this signal appears almost without attenuation at the base of transistor Q1. The fast signal causes the DC operation point of transistor Q1 to move, stopping or interrupting oscillation. The oscillation resumes as capacitor C1 charges and the transistor base voltage comes back to a normal steady state value.

Figure 3:
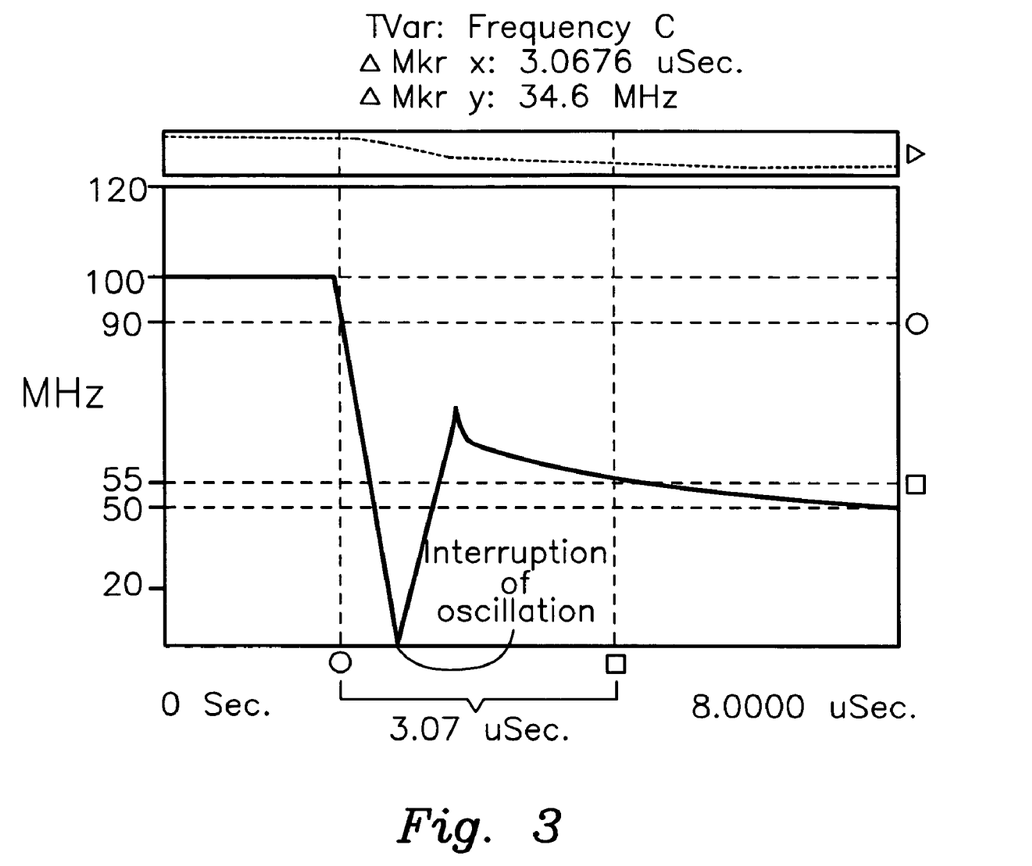
FIG. 3 is a graph of the frequency response of the Clapp oscillator of FIG. 1 when a sharp step-down voltage is applied to the tuning port.

FIG. 3 shows a graph of the frequency response of the Clapp oscillator of FIG. 1 when a sharp step-down or decreasing voltage is applied to the tuning port. The effect is similar for a decreasing voltage. If the modulating signal applied to the tuning port of a VCO decreases from 11 volts to 1 volt in 2 nanoseconds, the negative pulse on the base of transistor Q1 results in the transistor turning off, stopping oscillation. The transistor may even enter an operating condition where it can sustain damage during the positive or negative pulse.

Figure 4:
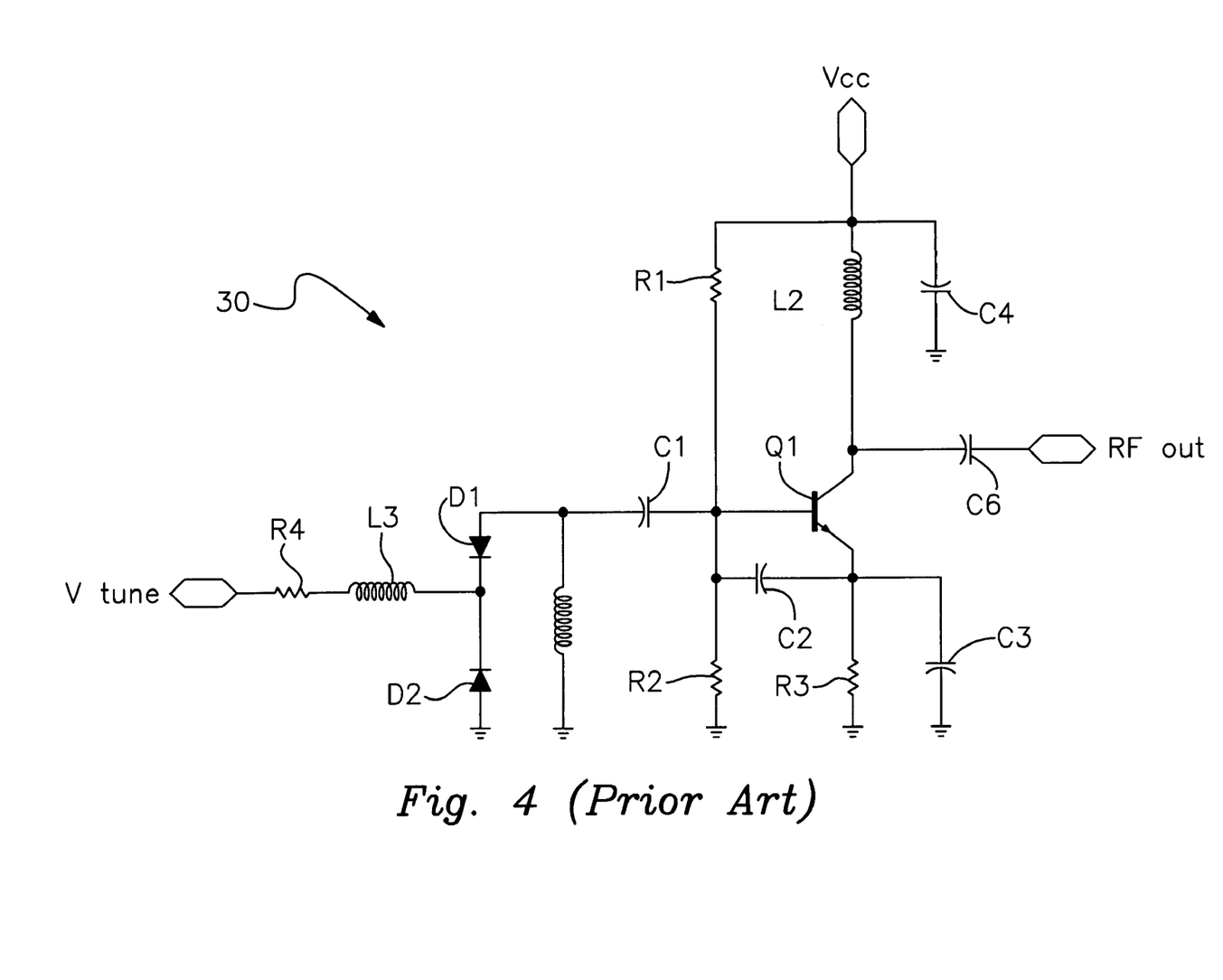
FIG. 4 is a schematic diagram of a Colpitts voltage controlled oscillator of the prior art.

Turning to FIG. 4, a schematic diagram of a typical Colpitts voltage controlled oscillator 30 is shown. The Colpitts oscillator handles a narrower frequency range than the Clapp oscillator circuit. Also, the 3 dB modulation bandwidth and tuning speed are better in a Colpitts oscillator than a Clapp oscillator. The frequency limitations for the Colpitts oscillator are capacitors C1 and C2. In the Colpitts oscillator, capacitor C1 has a lower value and charges faster. The frequency tuning range of a Colpitts oscillator is a 5 to 10 percent change in frequency. A sharp step up voltage applied to the tuning port of the Colpitts oscillator has less effect because the resonator inductor L1 is a low shunt impedance to ground and capacitor C1 has a high series impedance to the base of transistor Q1. Colpitts oscillators typically do not have a problem with oscillation interruption during fast tuning. Unfortunately, they are limited to being able to tune frequencies in only a narrow frequency range.

While various oscillators have been used, a continuing need exists for a voltage controlled oscillator that has improved electrical performance. In particular, a voltage controlled oscillator that can rapidly change frequencies over a wide frequency range without an interruption in oscillation is needed.

SUMMARY

It is a feature of the invention to provide a voltage controlled oscillator that can rapidly change frequencies over a wide range.

It is a feature of the invention to provide a voltage controlled oscillator that can change frequencies without an interruption in oscillation.

Another feature of the invention to provide a voltage controlled oscillator that includes a transistor having a base, an emitter and a collector. An output port and a power supply port are connected to the collector. A high pass filter is connected between ground and the base of the transistor. A tuning element is connected between the high pass filter and ground. The tuning element includes a first and second varactor diode. The varactor diodes have their cathodes connected together at a first node. A series combination of a resistor and inductor are connected between a tuning port and the first node. A capacitor is connected between the first node and the emitter.

BRIEF DESCRIPTION OF THE DRAWINGS

It is noted that the drawings of the invention are not to scale. In the drawings, like numbering represents like elements between the drawings.

DETAILED DESCRIPTION

Figure 5:
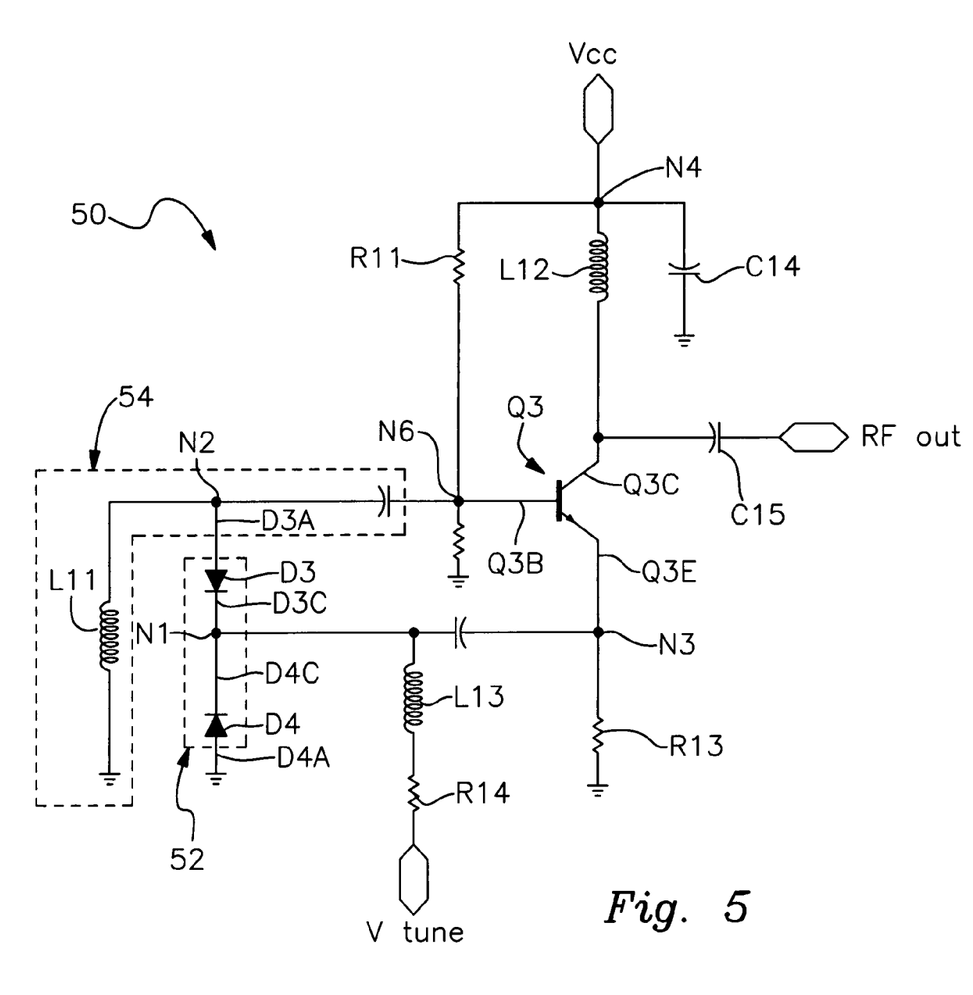
FIG. 5 is a schematic diagram of a voltage controlled oscillator in accordance with the present invention.

FIG. 5 shows a schematic diagram of a voltage controlled oscillator 50. Voltage controlled oscillator 50 has a power supply port Vcc, an output port RF out and a tuning port Vtune. A transistor Q3 has a base Q3B, a collector Q3C and an emitter Q3E. Voltage controlled oscillator 50 also has a tuning element 52 and a high pass filter 54. High pass filter 54 is connected between ground and base QB3. Tuning element 52 is connected between the high pass filter 54 and ground.

The tuning element 52 includes conventional varactor diodes D3 and D4. Varactor diodes have a variable capacitance that changes with voltage. While two varactor diodes are shown, more can be used. The ratio of the capacitance of varactor diode D3 to D4 can be about 1:2. Varactor diode D3 has an anode D3A and a cathode D3C. Varactor diode D4 has an anode D4A and a cathode D4C. Cathodes D3C and D4C are connected together at node N1. Anode D4A is connected to ground. Anode D3A is connected to node N2.

High pass filter 54 includes the series combination of inductor L11 and capacitor C11. Inductor L11 has one end connected to ground and another end connected to node N2. Capacitor C11 has one end connected to node N2 and another end connected to base Q3B.

Resistor R14 and inductor L13 are series connected between tuning port Vtune and node N1. Resistor R14 has one end connected to tuning port Vtune and the other end connected to inductor L13. Inductor L13 has one end connected to resistor R14 and another end connected to node N1. A capacitor C16 is connected between node N1 and node N3. Resistor R13 is connected between node N3 (emitter) and ground. Resistor R12 is connected between node N6 (base) and ground.

Resistor R11 is connected between node N6 (base) and node N4 (power supply). Inductor L12 is connected between node N5 (collector) and node N4 (power supply). Capacitor C14 is connected between ground and node N4 (power supply). Capacitor C15 is connected between the output port RF out and node N5 (collector).

In operation, the high pass filter 54 of inductor L11 and capacitor C11 reduces the penetration of the tuning pulses form tuning port Vtune to the transistor base Q3B. Voltage controlled oscillator 50 combines the feedback elements and tuning elements into a unitary structure that provides a wide frequency tuning range and maintains a constant feedback ratio over the entire tuning range.

The pulse attenuation from the tuning port Vtune to the transistor base Q3B can be influenced to be similar to the attenuation from the tuning port Vtune to the emitter Q3E by the proper selection of the values of capacitors C11 and C16. This allows the base to emitter voltage to be unchanged and oscillation to continue without interruption. In addition, the voltage pulse from the tuning port to the output port and the power supply port is suppressed, reducing the leakage of parasitic spikes to other ports of the oscillator.

The following component values can be used in voltage controlled oscillator 50. Higher or lower values can also be used. Power supply Vcc is typically 10 volts.

R11 3000 ohms
R12 2000 ohms
R13 332 ohms
R14 1500 ohms
C11 150 pico-farads
C14 1 nano-farad
C15 100 pico-farads
C16 270 pico-farads
L11 270 nano-henries
L12 220 nano-henries

ALTERNATIVE EMBODIMENT

Figure 6:
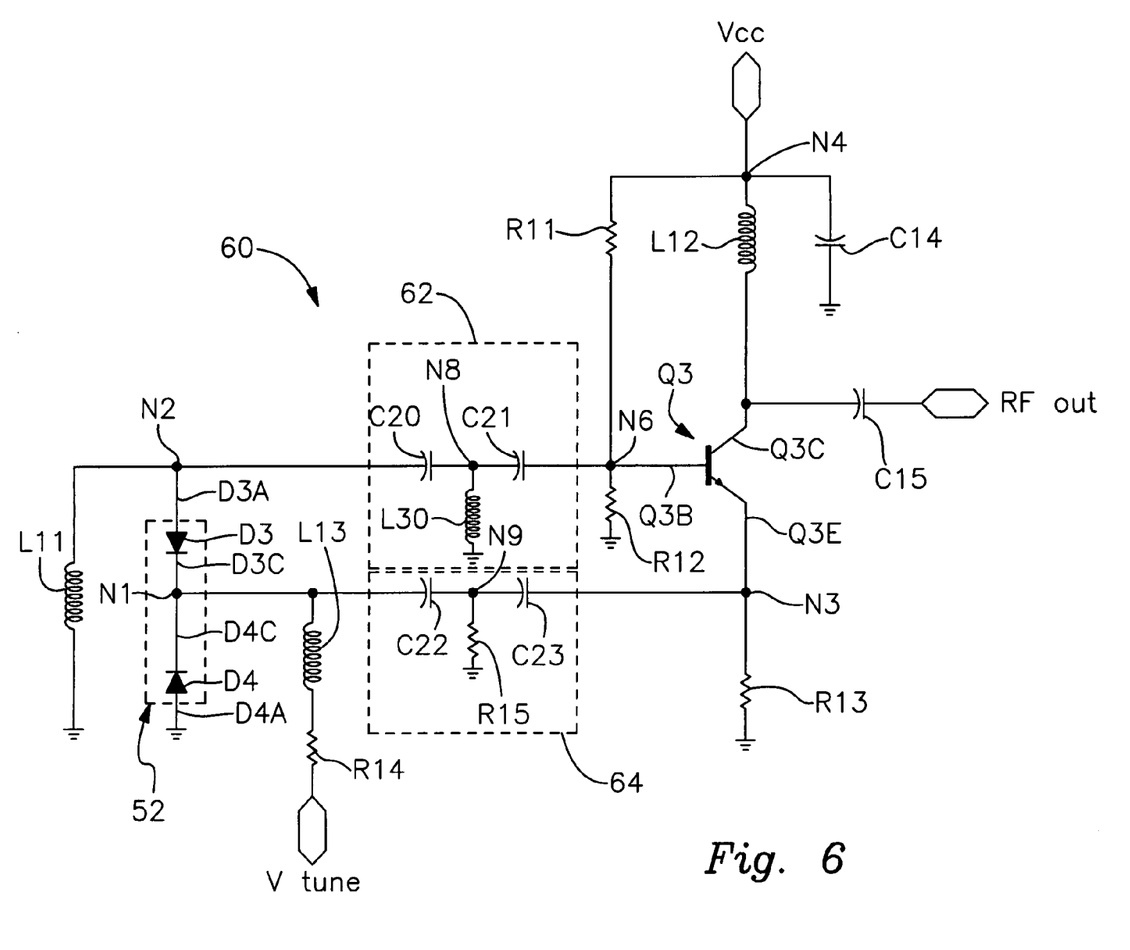
FIG. 6 is a schematic diagram of an alternative embodiment of a voltage controlled oscillator in accordance with the present invention.

FIG. 6 shows a schematic diagram of an alternative embodiment of a voltage controlled oscillator 60. Voltage controlled oscillator 60 is similar to voltage controlled oscillator 50. Capacitor C11 of oscillator 50 has been replaced with a high pass filter 62 and capacitor C16 of oscillator 50 has been replaced with a high pass filter 64.

High pass filter 62 includes capacitors C20 and C21 and inductor L30. One end of capacitor C20 is connected to node N2 and the other end is connected to node N8. Capacitor C21 has one end connected to node N6 and another end connected to node N8. Inductor L30 is connected between node N8 and ground. High pass filter 62 reduces the penetration of the tuning pulse from the tuning port to the transistor base Q3B.

High pass filter 64 includes capacitors C22 and C23 and resistor R15. One end of capacitor C22 is connected to node N1 and the other end is connected to node N9. Capacitor C23 has one end connected to node N3 and another end connected to node N9. Resistor R15 is connected between node N9 and ground. High pass filter 64 reduces the penetration of the tuning pulse from the tuning port to the emitter Q3E.

The following component values can be used in voltage controlled oscillator 60. Higher or lower values can also be used. Power supply Vcc is typically 10 volts.

R11 3000 ohms
R12 2000 ohms
R13 332 ohms
R14 1200 ohms
R15 300 ohms
C14 1 nano-farad
C15 100 pico-farads
C20 180 pico-farads
C21 180 pico-farads
C22 430 pico-farads
C23 430 pico-farads
L11 470 nano-henries
L12 220 nano-henries
L30 300 nano-henries

ELECTRICAL MEASUREMENTS

Figure 7:
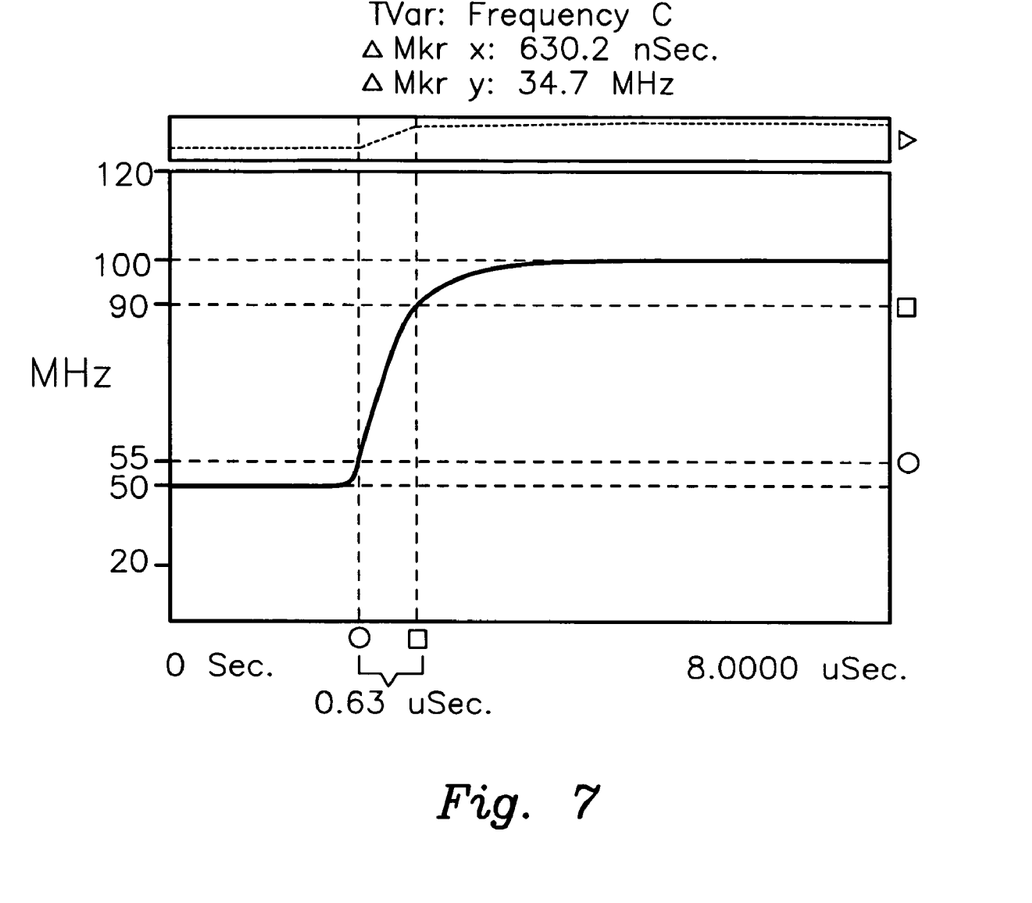
FIG. 7 is a graph of the frequency response of the oscillator of FIG. 5 when a sharp step-up voltage is applied to the tuning port.

Voltage controlled oscillator 50 was measured for electrical performance. Referring to FIG. 7, a graph of the frequency response of oscillator 50 when a sharp step-up voltage is applied to the tuning port is shown. The frequency range of 50 MHz to 100 MHz (2:1 ratio) was covered using a tuning voltage range of 0.7 to 10 volts with a rise time of 5 volts/nanosecond. Voltage controlled oscillator 50 was able to increase frequency from 55 MHz to 90 MHz (10% to 90% of initial and final values) within 0.63 microseconds. There was no interruption of the oscillator output signal during tuning. The tuning time is 3 times faster than for conventional voltage controlled oscillators.

Figure 8:
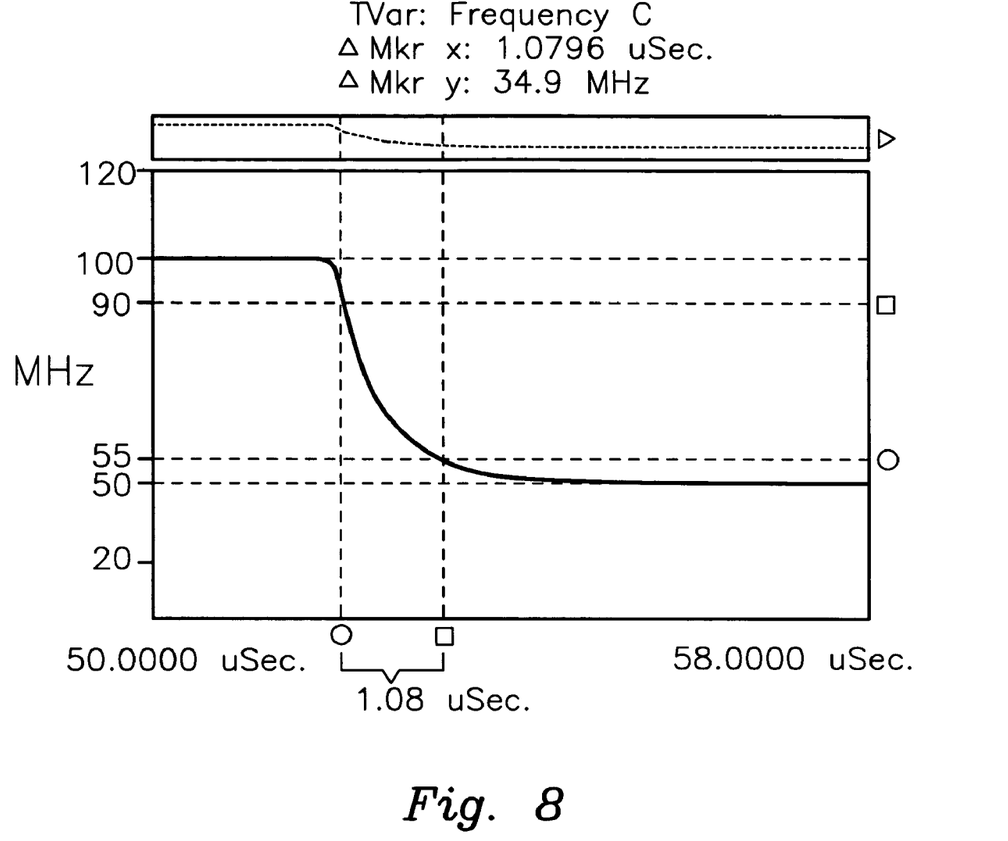
FIG. 8 is a graph of the frequency response of the oscillator of FIG. 5 when a sharp step-down voltage is applied to the tuning port.

Referring to FIG. 8, a graph of the frequency response of oscillator 50 when a sharp step-down voltage is applied to the tuning port is shown. The frequency range of 100 MHz to 50 MHz was covered using a tuning voltage range of 10 to 0.7 volts. Voltage controlled oscillator 50 was able to decrease frequency from 90 MHz to 55 MHz (90% to 10% of initial and final values) within 1.08 microseconds. There was no interruption of the oscillator output signal during tuning. The tuning time is 2.8 times faster than for conventional voltage controlled oscillators.

The tuning time to increase the oscillator frequency is shorter than to decrease the oscillator frequency because the charging and discharging currents are different. The charging resistor R12 has a lower value than the discharging resistor R11. The tuning time is very fast. The majority of the frequency change takes place within 47 periods of oscillation.

It is noted that the voltage controlled oscillator of the present invention can be fabricated for higher and lower frequencies than was shown in the present example.

The present invention has several advantages. Voltage controlled oscillator 50 can rapidly change frequencies over a wide bandwidth without interruptions in oscillation. The oscillator of the present invention has a shorter tuning time than oscillators of the prior art. Voltage controlled oscillator 50 has stable oscillation over the wide frequency range due to the combining of tuning elements. Voltage controlled oscillator 50 can rapidly be tuned to increase and decrease frequency. The present invention reduces voltage and current stresses applied to the transistor due to leakage from the tuning port to the transistor junctions. This also reduces the electrostatic discharge sensitivity of the oscillator. The new voltage controlled oscillator reduces the leakage of parasitic spikes from the tuning port to the other ports of the oscillator (output and power supply ports). The voltage controlled oscillator of the present invention provides an improvement over previous voltage controlled oscillators.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A voltage controlled oscillator having a tuning port for input of a pulsed signal, said voltage controlled oscillator comprising:
    a transistor having a base, and emitter and a collector;
    an output port connected to the collector;
    a power supply port connected to the collector;
    a high pass filter for substantially precluding penetration of said pulsed signal at said base of said transistor, said high pass filter connected between ground and the base of the transistor;
    a tuning element connected between the high pass filter and ground, the tuning element including a first and second varactor diode, the varactor diodes having their cathodes connected together at a first node;
    a series combination of a resistor and inductor connected between the tuning port and the first node; and
    a first capacitor connected between the first node and the emitter.

2. The voltage controlled oscillator according to claim 1, wherein a second resistor is connected between the emitter and ground.

3. The voltage controlled oscillator according to claim 1, wherein a third resistor is connected between the base and ground.

4. The voltage controlled oscillator according to claim 1, wherein a second capacitor is connected between the collector and the output port.

5. The voltage controlled oscillator according to claim 1, wherein a signal applied to the tuning port has a rise time greater than 5 volts per nanosecond.

6. The voltage controlled oscillator according to claim 1, wherein the high pass filter includes a second inductor and a third capacitor, the second inductor having one end connected to ground and another end connected to a second node, the third capacitor having one end connected to the second node and the other end connected to the base.

7. The voltage controlled oscillator according to claim 6, wherein the first varactor diode has an anode connected to the second node and a cathode connected to the first node, the second varactor diode having an anode connected to ground and a cathode connected to the first node.

8. A voltage controlled oscillator having a tuning port for input of a pulsed signal, said voltage controlled oscillator comprising:
    a transistor having a base, an emitter and a collector;
    an output port connected to the collector;
    a power supply port connected to the collector;
    a first high pass filter for substantially precluding penetration of said pulsed signal at said base of said transistor, said first high pass filter connected between ground and the base of the transistor;
    a tuning element connected between the high pass filter and ground, the tuning element including a first and second varactor diode, the varactor diodes having their cathodes connected together at a first node;
    a series combination of a first resistor and a first inductor connected between the tuning port and the first node; and
    a second high pass filter for substantially precluding penetration of said pulsed signal at said emitter of said transistor, said second high pass filter connected between the first node and the emitter.

9. The voltage controlled oscillator according to claim 8, wherein a second resistor is connected between the emitter and ground.

10. The voltage controlled oscillator according to claim 8, wherein a third resistor is connected between the base and ground.

11. The voltage controlled oscillator according to claim 8, wherein a second inductor is connected between ground and the first high pass filter.

12. The voltage controlled oscillator according to claim 8, wherein the first high pass filter includes a first capacitor, a second capacitor and a third inductor.

13. The voltage controlled oscillator according to claim 8, wherein the second high pass filter includes a third capacitor, a fourth capacitor and a fourth inductor.

14. The voltage controlled oscillator according to claim 8, wherein a signal applied to the tuning port has a rise time greater than 5 volts per nanosecond.

15. A voltage controlled oscillator having a tuning port for input of a pulsed signal, said voltage controlled oscillator comprising:
- a transistor having a base, an emitter and a collector;
- an output port connected to the collector;
- a power supply port connected to the collector;
- a first and second varactor diode, the varactor diodes each having an anode and a cathode, the cathodes connected together at a first node, the second varactor diode anode connected to ground;
- a high pass filter for substantially precluding penetration of said pulsed signal at said base of said transistor, said high pass filter connected between ground and the base of the transistor;
- said first varactor diode anode connected to the high pass filter;
- a series combination of a first resistor and a first inductor connected between the tuning port and the first node;
- a first capacitor connected between the first node and the emitter;
- a second resistor connected between the base and ground; and
- a third resistor connected between the emitter and ground.

16. The voltage controlled oscillator according to claim 15, wherein a second capacitor is connected between the collector and the output port.

17. The voltage controlled oscillator according to claim 15, wherein the high pass filter includes a series connected second inductor and a third capacitor.

18. The voltage controlled oscillator according to claim 15, wherein a third inductor is connected between the collector and the power supply port, a fourth capacitor is connected between the power supply port and ground and a fourth resistor is connected between the power supply port and the base.

19. The voltage controlled oscillator, according to claim 15, wherein a second high pass filter is connected between the first node and the emitter.

* * * * *